US012660251B2

(12) United States Patent
Choi et al.

(10) Patent No.: US 12,660,251 B2
(45) Date of Patent: Jun. 16, 2026

(54) THIN FILM TRANSISTOR ARRAY SUBSTRATE INCLUDING OXIDE SEMICONDUCTOR PATTERN AND DISPLAY DEVICE INCLUDING THE SAME

(71) Applicant: LG Display Co., Ltd., Seoul (KR)

(72) Inventors: Sung Ju Choi, Paju-si (KR); Young Hyun Ko, Paju-si (KR); Chan Yong Jeong, Paju-si (KR); Jung Seok Seo, Paju-si (KR); Jae Yoon Park, Paju-si (KR); Seo Yeon Im, Paju-si (KR); Jin Won Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 321 days.

(21) Appl. No.: 18/362,872

(22) Filed: Jul. 31, 2023

(65) Prior Publication Data

US 2024/0038902 A1 Feb. 1, 2024

(30) Foreign Application Priority Data

Aug. 1, 2022 (KR) ......................... 10-2022-0095396

(51) Int. Cl.
*H01L 29/786* (2006.01)
*H10D 30/67* (2025.01)
*H10K 59/121* (2023.01)
(52) U.S. Cl.
CPC ..... *H10D 30/6757* (2025.01); *H10D 30/6723* (2025.01); *H10D 30/6745* (2025.01); *H10K 59/1213* (2023.02)
(58) Field of Classification Search
CPC .... H10K 50/11; H10K 50/805; H10K 50/844;
H10K 50/156; H10K 59/1213; H10K 59/121; H10K 59/126; H10K 59/124; H10K 2102/351; H10K 2102/311; H10K 2102/3026; H10D 30/6757;
(Continued)

(56) References Cited

U.S. PATENT DOCUMENTS 11,271,015 B2 * 3/2022 Park ................... H10K 59/1213
11,659,738 B2 * 5/2023 Wang ................... H10D 86/481
257/43

(Continued)

FOREIGN PATENT DOCUMENTS

DE 102021116361 A1 12/2021
EP 3664152 B1 1/2025
(Continued)

OTHER PUBLICATIONS

English Translation KR 10-2087029.*

*Primary Examiner* — Nikolay K Yushin
(74) *Attorney, Agent, or Firm* — Seed Intellectual Property Law Group LLP

(57) ABSTRACT

The disclosure provides a driving thin film transistor and a switching thin film transistor each using an oxide semiconductor pattern as an active layer thereof. The driving thin film transistor and the switching thin film transistor include light shielding patterns, respectively. Each light shielding pattern includes a semiconductor material layer doped with P-type impurity ions. By virtue of the light shielding patterns including the semiconductor material layer, the driving thin film transistor and the switching thin film transistor achieve an increase in threshold voltage, thereby securing freedom of design.

17 Claims, 6 Drawing Sheets

(58) Field of Classification Search
CPC ........... H10D 30/6708; H10D 30/6715; H10D 30/67; H10D 30/6723; H10D 30/6745; H10D 30/6755; H10D 86/423; H10D 86/40; H10D 86/60; H10D 86/441
See application file for complete search history.

(56) References Cited

U.S. PATENT DOCUMENTS

| | | |
|---|---|---|
| 2015/0055051 A1 | 2/2015 | Osawa et al. |
| 2015/0187959 A1 | 7/2015 | Yoon |
| 2016/0197295 A1 | 7/2016 | Lee |
| 2017/0162606 A1 | 6/2017 | Yan et al. |
| 2018/0061927 A1 | 3/2018 | Jeong et al. |
| 2020/0411624 A1 | 12/2020 | Gu |
| 2021/0036029 A1* | 2/2021 | Park .................... H10D 86/431 |
| 2021/0183975 A1 | 6/2021 | Lee et al. |
| 2021/0202634 A1 | 7/2021 | Moon et al. |
| 2021/0202647 A1* | 7/2021 | Wang .................... H10D 86/60 |
| 2021/0408061 A1 | 12/2021 | Shin et al. |
| 2022/0165806 A1 | 5/2022 | Yun et al. |
| 2022/0190170 A1 | 6/2022 | Lee et al. |
| 2022/0208920 A1 | 6/2022 | Park |
| 2023/0169922 A1 | 6/2023 | Watakabe et al. |
| 2023/0207573 A1* | 6/2023 | Choi .................... H01L 24/73 257/91 |
| 2024/0038902 A1 | 2/2024 | Choi et al. |

FOREIGN PATENT DOCUMENTS

| | | | | |
|---|---|---|---|---|
| JP | H10319907 A | 12/1998 | | |
| JP | 2021131548 A | 9/2021 | | |
| KR | 20140071218 A | 6/2014 | | |
| KR | 20140102043 A | 8/2014 | | |
| KR | 20150002279 A | 1/2015 | | |
| KR | 20150034077 A | 4/2015 | | |
| KR | 20150074825 A | 7/2015 | | |
| KR | 20180003367 A | 1/2018 | | |
| KR | 10-2087029 | * 3/2020 | ............ | H01L 29/78 |
| TW | 200637010 A | 10/2006 | | |
| TW | 200816531 A | 4/2008 | | |
| TW | 201511256 A | 3/2015 | | |
| TW | 202533752 A | 8/2025 | | |
| WO | 2022/030199 A1 | 2/2022 | | |

* cited by examiner

THIN FILM TRANSISTOR ARRAY SUBSTRATE INCLUDING OXIDE SEMICONDUCTOR PATTERN AND DISPLAY DEVICE INCLUDING THE SAME

CROSS-REFERENCE TO RELATED APPLICATION(S)

This application claims the benefit of Korean Patent Application No. 10-2022-0095396, filed on Aug. 1, 2022, which is hereby incorporated by reference as if fully set forth herein.

BACKGROUND

Technical Field

The present disclosure relates to an array substrate of a thin film transistor.

Description of the Related Art

Recently, in accordance with advances in multimedia, the importance of a flat display device has increased. To cope with such a situation, flat display devices such as a liquid crystal display device, a plasma display device, an organic light emitting display device, etc., are being commercialized. Among such flat display devices, the organic light emitting display device is currently mainly used because the display device has fast response time, high luminance, and a wide viewing angle.

In such an organic light emitting device, a plurality of pixels is disposed in a matrix, and each of the pixels includes a light emitting device part represented by an organic light emitting layer and a pixel circuit part represented by a thin film transistor (hereinafter referred to as a "TFT"). The pixel circuit part includes a driving TFT configured to operate an organic light emitting element through supply of drive current and a switching TFT configured to supply a gate signal to the driving TFT.

In addition, a gate driving circuit part configured to provide a gate signal to each pixel may be disposed in a non-active area of the organic light emitting display device.

BRIEF SUMMARY

The present disclosure relates to an array substrate including a thin film transistor disposed at a pixel circuit part of a sub-pixel and configured to block leakage current in an off state and a thin film transistor configured to achieve free grayscale expression at low gray levels, and a display device including the same.

The present disclosure relates to an array substrate of a thin film transistor including an oxide semiconductor pattern, and more particularly to a thin film transistor array substrate enabling a thin film transistor disposed on a substrate to achieve low-grayscale expression, blockage of leakage current and an increase in threshold voltage, and a display device including the same. For example, the present disclosure relates to a display device in which an s-factor value of a driving thin film transistor is increased, thereby being capable of realizing a rapid on/off operation while achieving grayscale expression in a wide range.

The present disclosure is directed to a thin film transistor array substrate including an oxide semiconductor pattern and a display device including the same that substantially obviate one or more problems due to limitations and disadvantages of the related art.

The present disclosure provides an array substrate including a thin film transistor capable of exhibiting a high effect of blocking leakage current in an off state, securing a threshold voltage equal to or higher than a target value, achieving free grayscale expression at low gray levels, and securing an increased s-factor value while using an oxide semiconductor pattern as an active layer thereof, and a display device including the same.

Additional technical improvements, benefits, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In accordance with the purpose of the disclosure, as embodied and broadly described herein, a thin film transistor array substrate includes a substrate including an active area and a non-active area disposed around the active area, and a first thin film transistor including an upper buffer layer disposed on the substrate while including at least one inorganic insulating layer, a first oxide semiconductor pattern disposed on the upper buffer layer, a first gate electrode disposed over the first oxide semiconductor pattern while overlapping with the first oxide semiconductor pattern, and a first source electrode and a first drain electrode electrically connected to the first oxide semiconductor pattern, and a first light shielding pattern disposed under the first oxide semiconductor pattern while overlapping with the first oxide semiconductor pattern, and including a semiconductor material layer.

The thin film transistor array substrate may further include a second thin film transistor including a second oxide semiconductor pattern disposed on the upper buffer layer, a second gate electrode disposed over the second oxide semiconductor pattern while overlapping with the second oxide semiconductor pattern, a second source electrode and a second drain electrode electrically connected to the second oxide semiconductor pattern, and a second light shielding pattern disposed under the second oxide semiconductor pattern while overlapping with the second oxide semiconductor pattern and including a semiconductor material layer.

The thin film transistor array substrate may further include a third thin film transistor including a third oxide semiconductor pattern disposed on the upper buffer layer, a third gate electrode disposed over the third oxide semiconductor pattern while overlapping with the third oxide semiconductor pattern, a third source electrode and a third drain electrode electrically connected to the third oxide semiconductor pattern, and a third light shielding pattern disposed under the third oxide semiconductor pattern while overlapping with the third oxide semiconductor pattern.

The thin film transistor array substrate may further include a fourth thin film transistor including a lower buffer layer disposed on the substrate while including at least one insulating layer, a polycrystalline semiconductor pattern disposed on the lower buffer layer, and a fourth gate electrode disposed over the polycrystalline semiconductor pattern while overlapping with the polycrystalline semiconductor pattern, and a fourth source electrode and a fourth drain electrode electrically connected to the polycrystalline semiconductor pattern.

A first parasitic capacitance generated between the first light shielding pattern and the first oxide semiconductor pattern may be greater than a second parasitic capacitance generated between the first gate electrode and the first oxide semiconductor pattern.

A thickness of an insulating layer disposed between the first oxide semiconductor pattern and the first gate electrode may be greater than a thickness of an insulating layer disposed between the first oxide semiconductor pattern and the first light shielding pattern.

A permittivity of an insulating layer disposed between the first oxide semiconductor pattern and the first light shielding pattern may be greater than a permittivity of an insulating layer disposed between the first oxide semiconductor pattern and the first gate electrode.

Each of the first oxide semiconductor pattern, the second oxide semiconductor pattern, and the third oxide semiconductor pattern may be made of an N-type semiconductor material. The semiconductor material layer may be made of a P-type semiconductor material.

At least one of the first light shielding pattern, the second light shielding pattern or the third light shielding pattern may further include a metal pattern. The semiconductor material layer may be stacked on the metal pattern.

The second light shielding pattern may have a structure in which the metal pattern and the semiconductor material layer are stacked. The third light shielding pattern may be constituted only by the metal pattern.

The thin film transistor array substrate may further include at least one interlayer insulating layer disposed between the first light shielding pattern and the second light shielding pattern. The second light shielding pattern and the third light shielding pattern may be disposed on the same layer.

The first light shielding pattern and the second light shielding pattern may be disposed on the same layer.

The first thin film transistor may be a driving thin film transistor configured to drive a pixel. Each of the second thin film transistor and the third thin film transistor may be a switching thin film transistor.

The first light shielding pattern may have a structure embedded in the upper buffer layer.

The upper buffer layer may include a plurality of sub-upper buffer layers, and the sub-upper buffer layers may be disposed at upper and lower ends of the first light shielding pattern, respectively.

The second thin film transistor may be electrically connected to the first gate electrode of the first thin film transistor.

The fourth thin film transistor may be disposed in at least one of the non-active area or the active area, and the first thin film transistor may be disposed at a pixel in the active area.

The first light shielding pattern may be electrically connected to one of the first source electrode and the first drain electrode.

Reflectivity of the semiconductor material layer may be lower than reflectivity of the metal pattern.

The polycrystalline semiconductor pattern and the semiconductor material layer may be doped with P-type impurity ions.

In another aspect of the present disclosure, there is provided a thin film transistor array substrate including a substrate including an active area and a non-active area disposed around the active area, and a switching thin film transistor disposed on the substrate, wherein the switching thin film transistor includes a buffer layer disposed on the substrate, an oxide semiconductor pattern disposed on the buffer layer, a gate electrode disposed over the oxide semiconductor pattern while overlapping with the oxide semiconductor pattern, a source electrode and a drain electrode electrically connected to the oxide semiconductor pattern, and a light shielding pattern disposed under the oxide semiconductor pattern while including a semiconductor material layer.

In another aspect of the present disclosure, there is provided a display device including the thin film transistor array substrate and a light emitting device part. The light emitting device part includes an anode disposed on the substrate, a cathode facing the anode, and a light emitting layer disposed between the anode and the cathode.

In another aspect, a thin film transistor includes a substrate; an oxide semiconductor pattern disposed over the substrate, the oxide semiconductor pattern including a source or drain region and a channel region lateral to the source or drain region; a gate electrode on the channel region of the oxide semiconductor pattern; and a light shielding pattern under the oxide semiconductor pattern and including a first layer of a semiconductor material and a second layer of a metal material, the first layer and second layer stacked on one another.

Technical improvements, benefits, and features of the present disclosure are not limited to those described above, and other technical improvements, benefits, and features of the present disclosure not yet described will be more clearly understood by those skilled in the art from the following detailed description.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION

Figure 1:
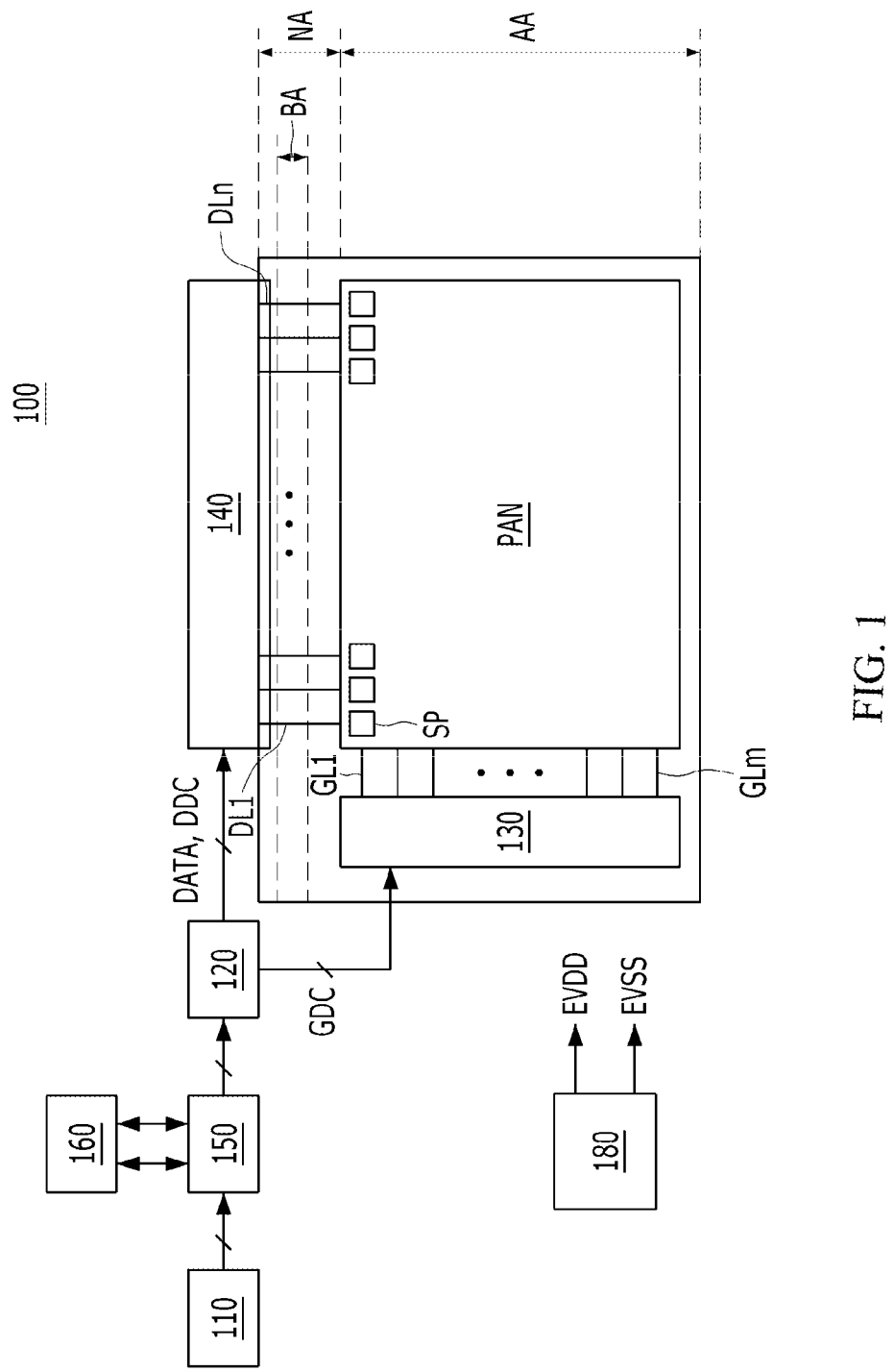
FIG. 1 is a schematic block diagram of a display device according to an example embodiment of the present disclosure.

Advantages and features of the present disclosure and methods for achieving the same will be made clear from embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete, and will fully convey the scope of the disclosure to those skilled in the art.

In the drawings for explaining the example embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has," used in this specification, do not preclude the presence or addition of other elements unless used along with the term "only." The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on," "above," "below," "next to," or the like, one or more other parts may be located between the two parts unless the term "directly" or "closely" is used.

In the description of the various embodiments of the present disclosure, when describing temporal relationships, for example, when the temporal relationship between two actions is described using "after," "subsequently," "next," "before," or the like, the actions may not occur in succession unless the term "directly" or "just" is used therewith.

It may be understood that, although the terms "first," "second," etc., may be used herein to describe various elements, these elements are not to be limited by these terms. These terms are merely used to distinguish one element from another. Therefore, in the present specification, an element indicated by "first" may be the same as an element indicated by "second" without exceeding the technical scope of the present disclosure, unless mentioned otherwise.

The respective features of the various embodiments of the present disclosure may be partially or wholly coupled to and combined with each other, and various technical linkages and modes of operation thereof are possible. These various embodiments may be performed independently of each other, or may be performed in association with each other.

Hereinafter, a first embodiment of the present disclosure will be described in detail with reference to the accompanying drawings.

FIG. 1 is a schematic block diagram of a display device 100 according to an example embodiment of the present disclosure.

Figure 2:
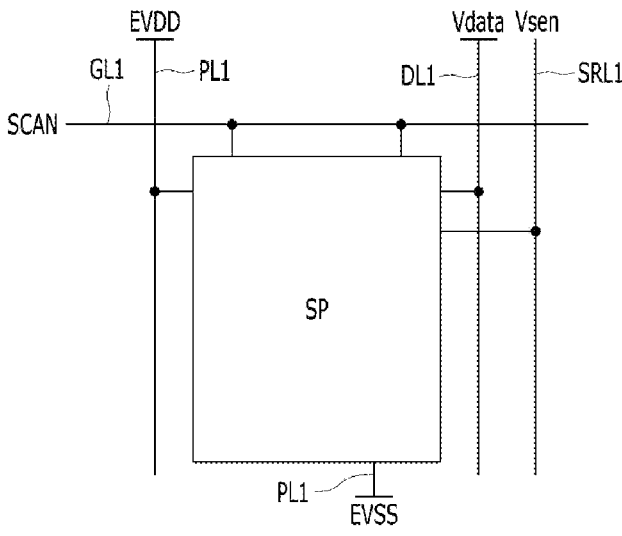
FIG. 2 is a schematic block diagram of a sub-pixel of the display device according to the example embodiment of the present disclosure.

FIG. 2 is a schematic block diagram of a sub-pixel SP shown in FIG. 1.

As shown in FIG. 1, the display device 100 includes an image processor 110, a degradation compensator 150, a memory 160, a timing controller 120, a data driver 140, a power supply 180, a gate driver 130, and a display panel PAN formed with the gate driver 130 therein. In particular, a non-active area NA of the display panel PAN includes a bending area BA. The display panel PAN may be folded in the bending area BA and, as such, a bezel thereof may be reduced.

The image processor 110 outputs drive signals for driving various devices, together with image data supplied from an exterior thereof.

The degradation compensator 150 modulates input image data Idata of each sub-pixel SP of a current frame based on a sensing voltage Vsen supplied from the data driver 140, and then supplies the modulated image data, that is, data Mdata, to the timing controller 120.

The timing controller 120 generates and outputs a gate timing control signal GDC for control of operation timing of the gate driver 130 and a data timing control signal DDC for control of operation timing of the data driver 140 based on a drive signal input from the image processor 110 thereto.

The gate driver 130 outputs a scan signal to the display panel PAN in response to the gate timing control signal GDC supplied from the timing controller 120. The gate driver 130 outputs the scan signal through a plurality of gate lines GL1 to GLm. In some implementations, the gate driver 130 may be configured to have a gate-in-panel (GIP) structure in which a thin film transistor is stacked on a substrate in the display device 100 which may be an organic electroluminescent display device. The GIP may include a plurality of circuits such as a shift register, a level shifter, etc.

The data driver 140 outputs a data voltage to the display panel PAN in response to the data timing control signal DDC input from the timing controller 120 thereto. The data driver 140 outputs the data voltage through a plurality of data lines DL1 to DLn.

The power supply 180 outputs a high-level drive voltage EVDD, a low-level drive voltage EVSS, etc., and supplies the output voltages EVDD, EVSS, etc., to the display panel PAN. The high-level drive voltage EVDD and the low-level drive voltage EVSS are supplied to the display panel PAN through power lines.

The display panel PAN displays an image, corresponding to the data voltage and the scan signal respectively supplied from the data driver 140 and the gate driver 130, which may be disposed in the non-active area NA, and power supplied from the power supply 180.

An active area AA of the display panel PAN is constituted by a plurality of sub-pixels SP and, as such, displays an actual image. The sub-pixels SP include a red (R) sub-pixel, a green (G) sub-pixel, and a blue (B) sub-pixel, or include a white (W) sub-pixel, a red (R) sub-pixel, a green (G) sub-pixel, and a blue (B) sub-pixel. In this case, the W, R, G, and B sub-pixels SP may be formed to have the same area or may be formed to have different areas, respectively.

The memory 160 not only stores a look-up table for degradation compensation gains, but also stores a degradation compensation time point of an organic light emitting element of each sub-pixel SP. In this case, the degradation compensation time point of the organic light emitting element may be the number of times when an organic light emitting display panel is driven or the time for which the organic light emitting display panel is driven.

Meanwhile, as shown in FIG. 2, each sub-pixel SP may be connected to one gate line, for example, the gate line GL1, one data line, for example, the data line DL1, one sensing voltage read-out line, for example, a sensing voltage read-out line SRL1, and one power line, for example, a power line PL1. The numbers of transistors and capacitors of the sub-pixel SP and the driving method of the sub-pixel SP are determined in accordance with a circuit configuration of the sub-pixel SP.

Figure 3:
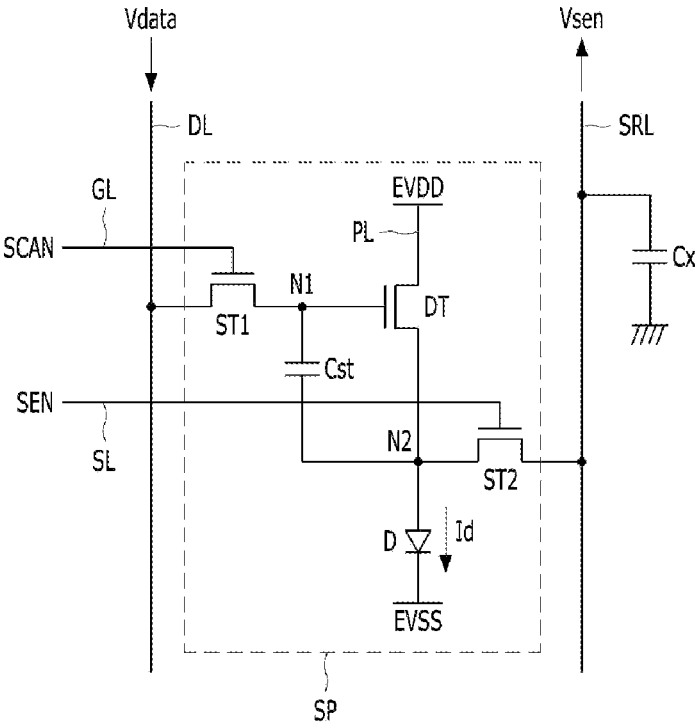
FIG. 3 is a circuit diagram of one sub-pixel of the display device according to the example embodiment of the present disclosure.

FIG. 3 is a circuit diagram of one sub-pixel SP of the display device 100 according to the example embodiment of the present disclosure.

As shown in FIG. 3, the display device 100 according to the example embodiment of the present disclosure includes a gate line GL, a data line DL, a power line PL, and a sensing line SL intersecting one another, thereby defining a sub-pixel SP, and includes a driving thin film transistor DT, a light emitting element D, a storage capacitor Cst, a first switching thin film transistor ST-1, and a second switching thin film transistor ST-2 at the sub-pixel SP.

The light emitting element D may include an anode connected to a second node N2, a cathode connected to an input terminal for a low-level drive voltage EVSS, and an organic light emitting layer disposed between the anode and the cathode.

The driving thin film transistor DT controls current Id flowing through the light emitting element D in accordance with a gate-source voltage Vgs thereof. The driving thin film transistor DT includes a gate electrode connected to a first node N1, a drain electrode connected to the power line PL, to receive a high-level drive voltage EVDD, and a source electrode connected to the second node N2.

The storage capacitor Cst is connected between the first node N1 and the second node N2.

When the display panel PAN is driven, the first switching thin film transistor ST-1 applies a data voltage Vdata charged in the data line DL to the first node N1 in response to a scan signal SCAN, thereby turning on the driving thin film transistor DT. In this case, the first switching thin film transistor ST-1 includes a gate electrode connected to the gate line GL, to receive the scan signal SCAN, a drain electrode connected to the data line DL, to receive the data voltage Vdata, and a source electrode connected to the first node N1. The first switching thin film transistor ST-1 is known as more sensitively operating than other switching thin film transistors in the pixel. To this end, it is necessary to increase a threshold voltage of the first switching thin film transistor ST-1, for easy control of the first switching thin film transistor ST-1.

The second switching thin film transistor ST-2 stores a source voltage of the second node N2 in a sensing capacitor Cx of a sensing voltage read-out line SRL by switching current between the second node N2 and the sensing voltage read-out line SRL in response to a sensing signal SEN. The second switching thin film transistor ST-2 resets a source voltage of the driving thin film transistor DT to an initialization voltage Vpre by switching current between the second node N2 and the sensing voltage read-out line SRL in response to the sensing signal SEN when the display panel PAN is driven. In this case, in the second switching thin film transistor ST-2, a gate electrode thereof is connected to the sensing line SL, a drain electrode thereof is connected to the second node N2, and a source electrode thereof is connected to the sensing voltage read-out line SRL.

Meanwhile, although a display device having a 3T1C structure including three thin film transistors and one storage capacitor has been illustrated and described, the display device of the present disclosure may be applied to various pixel structures such as 4T1C, 5T1C, 6T1C, 7T1C, and 8T1C without being limited to the above-described structure.

Figure 4A:
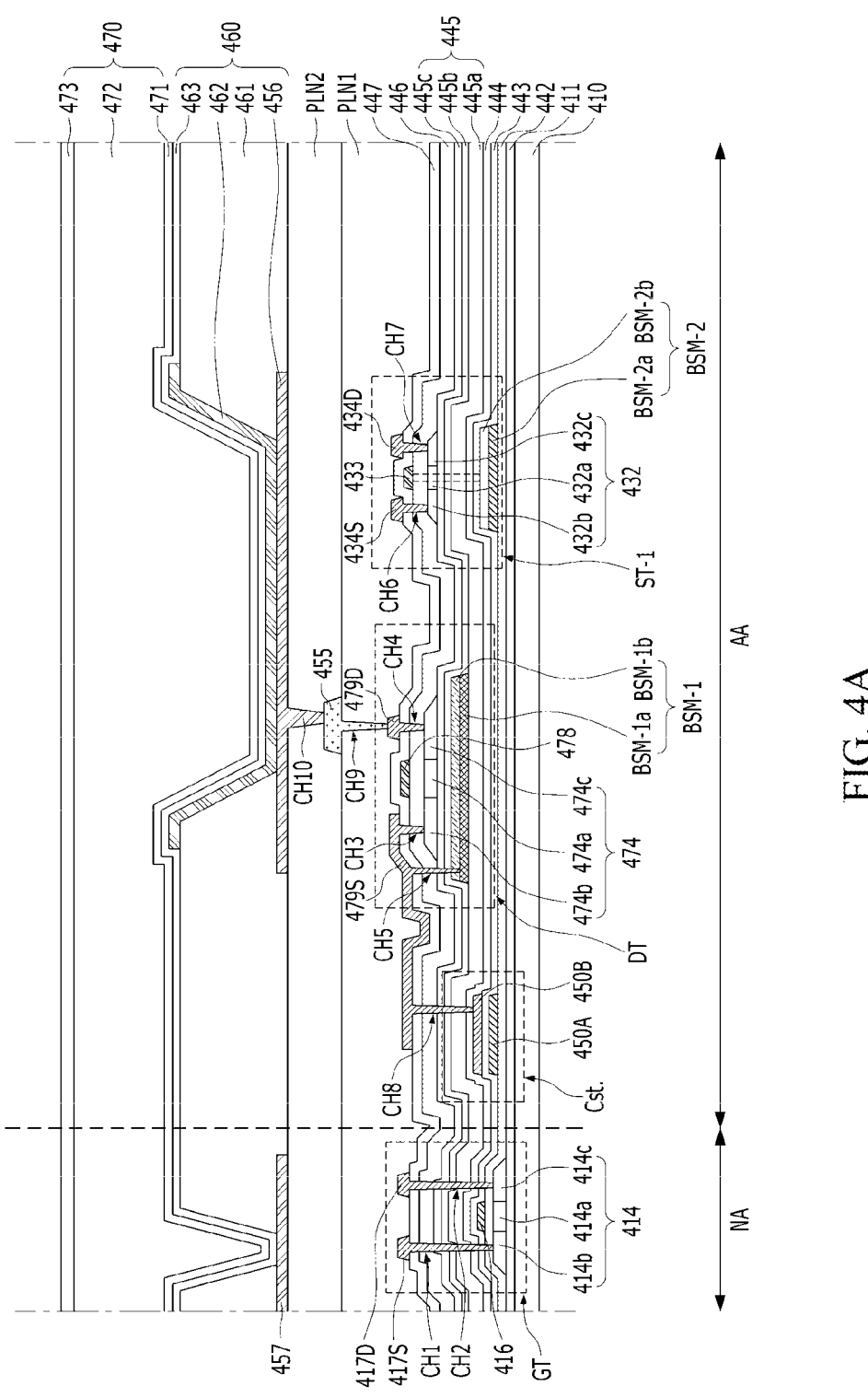
FIG. 4A is a cross-sectional view showing one thin film transistor disposed at a gate driving circuit part in a non-active area, a driving thin film transistor, a switching thin film transistor, and a storage capacitor disposed in an active area in accordance with a first embodiment of the present disclosure.

Meanwhile, FIG. 4A is a cross-sectional view showing one thin film transistor GT for a gate driving circuit, which is a representative thin film transistor disposed in a non-active area NA, for example, a GIP area, while including a polycrystalline semiconductor pattern, a driving thin film transistor DT disposed in a sub-pixel in an active area AA while including an oxide semiconductor pattern configured to drive a light emitting element, a first switching thin film transistor ST-1 including an oxide semiconductor pattern, and a storage capacitor Cst in accordance with the first embodiment of the present disclosure.

As shown in FIG. 4A, the driving thin film transistor DT and the first switching thin film transistor ST-1 are disposed in a sub-pixel on a substrate 410. Although the driving thin film transistor DT and only one switching thin film transistor ST-1 are illustrated in FIG. 4A, this illustration is only for convenience of description, and a plurality of switching thin film transistors may actually be disposed on the substrate 410.

In addition, a plurality of thin film transistors GT for a gate driving circuit constituting a gate driver may be disposed in the non-active area NA on the substrate 410, for example, the GIP area. The thin film transistor GT for the gate driving circuit, which will be referred to as a "gate driving thin film transistor GT," may use a polycrystalline semiconductor pattern as an active layer thereof.

Although the case in which the gate driving thin film transistor GT including the polycrystalline semiconductor pattern is disposed in the non-active area NA is described in the first embodiment, a switching thin film transistor having the same structure as that of the gate driving thin film transistor GT may be disposed in the sub-pixel.

Of course, the gate driving thin film transistor GT disposed in the non-active area NA and the switching thin film transistor disposed in the active area AA may have different configurations, like an N-type thin film transistor and a P-type thin film transistor, because kinds of impurities implanted therein are different.

Meanwhile, the plurality of thin film transistors disposed in the gate driver may constitute a CMOS configuration in which a thin film transistor for a gate driving circuit including a polycrystalline semiconductor pattern and a switching thin film transistor including an oxide semiconductor pattern are paired.

The following description will be given in conjunction with an example in which a thin film transistor for a gate driving circuit using a polycrystalline semiconductor pattern as an active layer thereof is disposed in the non-active area NA.

The gate driving thin film transistor GT includes a polycrystalline semiconductor pattern 414 disposed on a lower buffer layer 411 formed on the substrate 410, a first gate insulating layer 442 configured to insulate the polycrystalline semiconductor pattern 414, a first gate electrode 416 disposed on the first gate insulating layer 442 while overlapping with the polycrystalline semiconductor pattern 414, a plurality of insulating layers formed on the first gate electrode 416, and a first source electrode 417S and a first drain electrode 417D disposed on the plurality of insulating layers.

The substrate 410 may be constituted by a multilayer structure in which an organic layer and an inorganic layer are alternately stacked. For example, the substrate 410 may have a multilayer structure in which an organic layer of, for example, polyimide, and an inorganic layer of, for example, silicon oxide (SiO$_2$), are alternately stacked.

The lower buffer layer 411 is formed on the substrate 410. The lower buffer layer 411 functions to prevent moisture, etc., from penetrating from the outside. The lower buffer layer 411 may be formed by depositing an inorganic insulating layer of, for example, silicon oxide (SiO$_2$), in a number of at least one layer.

The polycrystalline semiconductor pattern 414 is formed on the lower buffer layer 411. The polycrystalline semiconductor pattern 414 is used as the active layer of the thin film transistor. The polycrystalline semiconductor pattern 414 includes a first channel region 414a, and a first source region 414b and a first drain region 414c facing each other under the condition that the first channel region 414a is interposed therebetween.

The polycrystalline semiconductor pattern 414 is insulated by the first gate insulating layer 442. The first gate insulating layer 442 is formed by depositing an inorganic insulating layer of, for example, silicon oxide (SiO$_2$), in a number of at least one layer on the entire surface of the substrate 410 formed with the polycrystalline semiconductor pattern 414. The first gate insulating layer 442 protects and insulates the polycrystalline semiconductor pattern 414 from the outside.

The first gate electrode 416 overlapping with the first channel region 414a of the polycrystalline semiconductor pattern 414 is formed on the first gate insulating layer 442.

The first gate electrode 416 may be made of a metal material. For example, the first gate electrode 416 may take the form of a single layer or multiple layers made of one of molybdenum (Mo), aluminum (Al), chromium (Cr), gold (Au), titanium (Ti), nickel (Ni), neodymium (Nd), and copper (Cu) or an alloy thereof, without being limited thereto.

A plurality of insulating layers may be formed between the first gate electrode 416 and the first source/drain electrodes 417S and 417D.

Referring to FIG. 4A, the plurality of insulating layers may be a first interlayer insulating layer 443 contacting an upper surface of the first gate electrode 416, and a second interlayer insulating layer 444, an upper buffer layer 445, a second gate insulating layer 446, and a third interlayer insulating layer 447 sequentially stacked on the first interlayer insulating layer 443 in this order.

The first source electrode 417S and the first drain electrode 417D are disposed on the third interlayer insulating layer 447. The first source electrode 417S and the first drain electrode 417D are connected to the polycrystalline semiconductor pattern 414 through a first contact hole CH1 and a second contact hole CH2, respectively. The first contact hole CH1 and the second contact hole CH2 extend through the first gate insulating layer 442, the first interlayer insulating layer 443, the second interlayer insulating layer 444, the upper buffer layer 445, the second gate insulating layer 446, and the third interlayer insulating layer 447, thereby exposing the first source region 414b and the first drain region 414c of the polycrystalline semiconductor pattern 414, respectively.

Meanwhile, the driving thin film transistor DT, the first switching thin film transistor ST-1, and the storage capacitor Cst are disposed at the sub-pixel in the active area AA.

In the first embodiment, each of the driving thin film transistor DT and the first switching thin film transistor ST-1 uses an oxide semiconductor material as an active layer thereof.

The driving thin film transistor DT includes a first oxide semiconductor pattern 474, a second gate electrode 478 overlapping with the first oxide semiconductor pattern 474, and a second source electrode 479S and a second drain electrode 479D electrically connected to the first oxide semiconductor pattern 474.

The oxide semiconductor may be made of an oxide of a metal such as zinc (Zn), indium (In), gallium (Ga), tin (Sn), titanium (Ti), or the like, or a combination of a metal such as zinc (Zn), indium (In), gallium (Ga), tin (Sn), titanium (Ti), or the like and an oxide thereof. More specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or the like.

Generally, a polycrystalline semiconductor pattern advantageous in terms of high-speed operation is used as an active layer of a driving thin film transistor. In the case of a driving thin film transistor including a polycrystalline semiconductor pattern, there may be a problem in terms of power consumption in that leakage current is generated in an off state of the driving thin film transistor. In particular, the problem of generation of leakage current in an off state of the driving thin film transistor may be severe when the display device is driven at a low speed to display a still image such as a document screen. To this end, in the first embodiment of the present disclosure, a driving thin film transistor using, as an active layer thereof, an oxide semiconductor pattern advantageous in preventing generation of leakage current is proposed.

However, when the thin film transistor uses an oxide semiconductor pattern as an active layer thereof, a current fluctuation value with respect to a voltage fluctuation value may be great due to characteristics of an oxide semiconductor material and, as such, failure may frequently occur in a low-grayscale range in which precise current control is required. Therefore, in accordance with the first embodiment of the present disclosure, a driving thin film transistor in which fluctuation in current is relatively insensitive to fluctuation in a voltage applied to a gate electrode is proposed.

Figure 4B:
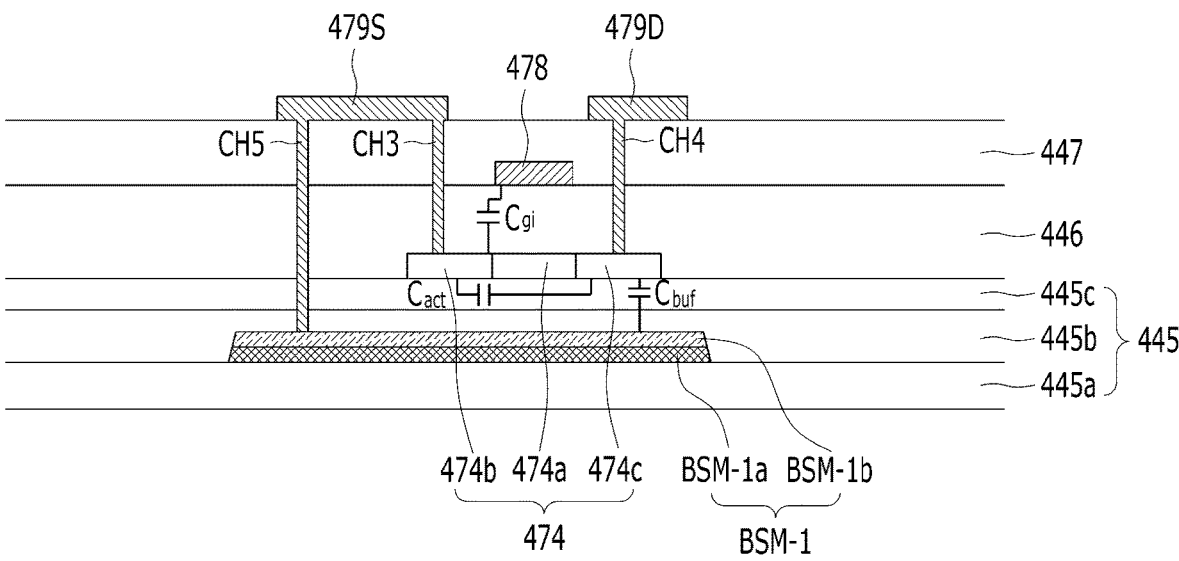
FIG. 4B is an enlarged cross-sectional view in which only the driving thin film transistor shown in FIG. 4A is enlarged.
Figure 4C:
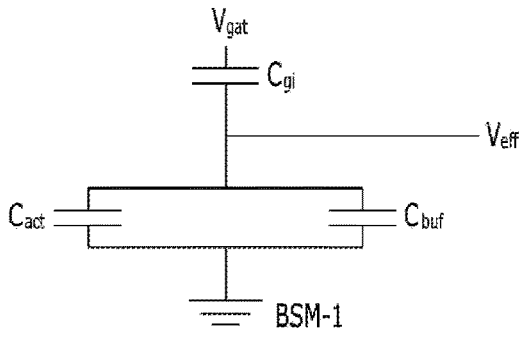
FIG. 4C is a circuit diagram showing a relation among parasitic capacitances generated in the configuration of FIG. 4B.

A structure of the driving thin film transistor will be described with reference to FIGS. 4A to 4C. FIG. 4B is an enlarged cross-sectional view in which only the driving thin film transistor DT shown in FIG. 4A is enlarged. FIG. 4C is a circuit diagram showing a relation among parasitic capacitances generated in the driving thin film transistor DT.

The driving thin film transistor DT includes the first oxide semiconductor pattern 474, which is disposed on the upper buffer layer 445, the second gate insulating layer 446, which covers the first oxide semiconductor pattern 474, the second gate electrode 478, which is formed on the second gate insulating layer 446 while overlapping with the first oxide semiconductor pattern 474, and the second source electrode 479S and the second drain electrode 479D, which are disposed on the third interlayer insulating layer 447 covering the second gate electrode 478. The second gate electrode 478, the second source electrode 479S, and the second drain electrode 479D may be disposed on the same layer.

The first oxide semiconductor pattern 474, which is an active layer, includes a second channel region 474a, through which charges move, and a second source region 474b and a second drain region 474c disposed adjacent to the second channel region 474a under the condition that the second channel region 474a is interposed therebetween.

Meanwhile, a first light shielding pattern BSM-1 is formed under the first oxide semiconductor pattern 474. The first light shielding pattern BSM-1 prevents light incident from the outside from irradiating the first oxide semiconductor pattern 474, thereby preventing the first oxide semiconductor pattern 474 sensitive to external light from malfunctioning.

In the first embodiment of the present disclosure, the first light shielding pattern BSM-1 may be configured through inclusion of a semiconductor material layer.

Referring to FIGS. 4A and 4B, the first light shielding pattern BSM-1 may have a structure in which a first layer BSM-1a constituted by a conductive material layer such as a metal pattern, and a second layer BSM-1b constituted by a semiconductor material layer are stacked.

The semiconductor material layer may be various kinds of semiconductor material layers made of an amorphous semiconductor material, a polycrystalline semiconductor material, an oxide semiconductor material, etc.

The semiconductor material layer may be a P-type semiconductor material layer doped with P-type impurity ions such as boron ions.

The thin film transistor using an oxide semiconductor pattern as an active layer thereof is an N-type thin film transistor. Accordingly, when P-type impurity ions are implanted into the semiconductor material layer, the Fermi level of the semiconductor material layer is lowered. In addition, the Fermi level of the first oxide semiconductor pattern 474 corresponding to the semiconductor material layer is also lowered in order to achieve balance of Fermi levels in a thermal equilibrium state. Accordingly, a threshold voltage Vth required to turn on the driving thin film transistor DT may be increased.

The driving thin film transistor DT including the first oxide semiconductor pattern 474 requires a very high threshold voltage in terms of design, as compared to other switching thin film transistors in the pixel. In some implementations, the switching thin film transistors require a threshold voltage approximate to 0 V, whereas the driving thin film transistor DT requires a threshold voltage of 1 V or more. Accordingly, the driving thin film transistor DT according to the embodiment of the present disclosure has an advantage in that an increase in threshold voltage may be achieved because a semiconductor material layer doped with P-type impurity ions is disposed under the first oxide semiconductor pattern 474.

In addition, the first layer BSM-1a of the first light shielding pattern BSM-1 may be a metal layer including titanium (Ti) capable of collecting hydrogen particles. For example, the metal layer may be a single titanium layer, a dual layer of molybdenum (Mo) and titanium (Ti), or an alloy layer of molybdenum (Mo) and titanium (Ti). However, the embodiment of the present disclosure is not limited to the above-described condition, and other metal layers including titanium (Ti) may also be used.

Titanium (Ti) may collect hydrogen particles diffused into the upper buffer layer 445, thereby preventing the hydrogen particles from reaching the first oxide semiconductor pattern 474.

In some implementations, the first light shielding pattern BSM-1 is constituted by a plurality of layers. In some implementations, the first light shielding pattern BSM-1 have a stack structure in which the semiconductor material layer is disposed at an uppermost side. As such, the semiconductor layer is exposed upwards during execution of a process, which enables P-type impurity ions to be implanted into the semiconductor material layer.

In some implementations, the first light shielding pattern BSM-1 is formed vertically under the first oxide semiconductor pattern 474, and overlaps with the first oxide semiconductor pattern 474. In addition, the first light shielding pattern BSM-1 may be formed to have a greater size than that of the first oxide semiconductor pattern 474, and completely overlaps with the first oxide semiconductor pattern 474.

The semiconductor material layer included in the first light shielding pattern BSM-1 has a lower reflectivity than the metal layer included in the first light shielding pattern BSM-1. Accordingly, it may be possible to reduce a phenomenon in which external light is incident into the first oxide semiconductor pattern 474 after being reflected by the first light shielding pattern BSM-1.

Meanwhile, the second source electrode 479S of the driving thin film transistor DT is electrically connected to the first light shielding pattern BSM-1. When the first light shielding pattern BSM-1 is electrically connected to the second source electrode 479S, the following additional effect may be obtained.

As the second source region 474b and the second drain region 474c of the first oxide semiconductor pattern 474 become conductive, a parasitic capacitance $C_{act}$ is generated in the first oxide semiconductor pattern 474 in an on/off operation. In addition, a parasitic capacitance $C_{gi}$ is generated between the second gate electrode 478 and the first oxide semiconductor pattern 474. In addition, a parasitic capacitance $C_{buf}$ is generated between the first light shielding pattern BSM-1 electrically connected to the second source electrode 479S and the first oxide semiconductor pattern 474.

Since the first oxide semiconductor pattern 474 and the first light shielding pattern BSM-1 are electrically interconnected by the second source electrode 479S, the parasitic capacitance $C_{act}$ and the parasitic capacitance $C_{buf}$ are connected in parallel, and the parasitic capacitance $C_{act}$ and the parasitic capacitance $C_{gi}$ are connected in series. In addition, when a gate voltage of $V_{gat}$ is applied to the second gate electrode 478, an effective voltage $V_{eff}$ actually applied to the first oxide semiconductor pattern 474 satisfies the following Expression 1.

$$\Delta V_{eff} = \frac{C_{gi}}{C_{gi} + C_{buf} + C_{act}} * \Delta V_{gat}$$

Thus, the effective voltage $V_{eff}$ applied to the second channel region 474a is inversely proportional to the parasitic capacitance $C_{buf}$ and, as such, it may be possible to adjust the effective voltage $V_{eff}$ applied to the first oxide semiconductor pattern 474 by adjusting the parasitic capacitance $C_{buf}$.

That is, when the first light shielding pattern BSM-1 is disposed near the first oxide semiconductor pattern 474, to increase the parasitic capacitance $C_{buf}$, it may be possible to reduce an actual value of current flowing through the first oxide semiconductor pattern 474.

Reduction in the effective value of current flowing through the first oxide semiconductor pattern 474 means that an s-factor may be increased, and means that an actual control range of the driving thin film transistor DT controllable through the voltage $V_{gat}$ applied to the second gate electrode 478 may be widened.

That is, when the second source electrode 479S of the driving thin film transistor DT is electrically connected to the first light shielding pattern BSM-1, and the first light shielding pattern BSM-1 is disposed near the first oxide semiconductor pattern 474, it may be possible to accurately control the organic light emitting element even at low gray levels and, as such, to solve a problem of a Mura defect frequently generated at low gray levels.

Accordingly, in the first embodiment of the present disclosure, the parasitic capacitance $C_{buf}$ generated between the first oxide semiconductor pattern 474 and the first light shielding pattern BSM-1 may be greater than the parasitic capacitance $C_{gi}$ generated between the second gate electrode 478 and the first oxide semiconductor pattern 474.

Here, "s-factor" means a reciprocal value of a current variation to a gate voltage variation in an on/off transition period of a thin film transistor. That is, the s-factor may be a reciprocal value of a gradient of a curve in a characteristic graph of a drain current with respect to a gate voltage (V-I curve graph).

A small s-factor means a great gradient of a characteristic graph of a drain current with respect to a gate voltage. Accordingly, when a thin film transistor has a small s-factor, the thin film transistor may be turned on even by a low voltage and, as such, switching characteristics of the thin film transistor becomes better. However, sufficient grayscale expression is difficult because the thin film transistor reaches a threshold voltage within a short time.

A great s-factor means a small gradient of the characteristic graph of the drain current with respect to the gate voltage. Accordingly, when a thin film transistor has a great s-factor, the on/off response time of the thin film transistor may be degraded and, as such, switching characteristics of the thin film transistor may be degraded. However, sufficient grayscale expression may be possible because the thin film transistor reaches a threshold voltage after a relatively long time.

In some implementations, the first light shielding pattern BMS-1 may be disposed near the first oxide semiconductor pattern 474 while being embedded in the upper buffer layer 445. In the first embodiment, use of a plurality of sub-upper buffer layers is illustrated.

That is, the upper buffer layer 445 may have a structure in which a first sub-upper buffer layer 445a, a second sub-upper buffer layer 445b, and a third sub-upper buffer layer 445c are sequentially stacked. The first light shielding pattern BSM-1 may be formed over the first sub-upper buffer layer 445a. In addition, the second sub-upper buffer layer 445b completely covers the first light shielding pattern BSM-1. In addition, the third sub-upper buffer layer 445c is formed over the second sub-upper buffer layer 445b. This configuration is an example of the configuration in which the first light shielding pattern BSM-1 is embedded in the upper buffer layer 445.

The first sub-upper buffer layer 445a and the third sub-upper buffer layer 445c may be constituted by silicon oxide ($SiO_2$).

When the first sub-upper buffer layer 445a and the third sub-upper buffer layer 445c are constituted by silicon oxide ($SiO_2$) not including hydrogen particles, it is possible to prevent hydrogen particles from penetrating into the oxide semiconductor pattern during heat treatment. When hydrogen particles penetrate into the oxide semiconductor pattern, reliability of the thin film transistor is degraded.

On the other hand, the second sub-upper buffer layer 445b may be constituted by silicon nitride ($SiN_x$) having an excellent hydrogen particle collection ability. The second sub-upper buffer layer 445b may be formed only in a region where the first light shielding pattern BSM-1 is formed, to completely encapsulate the first light shielding pattern BSM-1. That is, a silicon nitride ($SiN_x$) layer may be partially formed on the first sub-upper buffer layer 445a in order to completely cover an upper surface and a side surface of the first light shielding pattern BSM-1. In addition, the second sub-upper buffer layer 445b may be formed on the entire surface of the first sub-upper buffer layer 445a formed with the first light shielding pattern BSM-1.

Silicon nitride ($SiN_x$) is excellent in terms of hydrogen particle collection ability, as compared to silicon oxide ($SiO_2$). When hydrogen particles penetrate into an active layer constituted by an oxide semiconductor material, resultant thin film transistors may have a problem in that the thin film transistors have different threshold voltages or different conductivities at channels thereof. That is, reliability of the thin film transistors is degraded. For example, in the case of a driving thin film transistor, securing reliability is important because the driving thin film transistor directly contributes to operation of the light emitting element associated therewith.

In the first embodiment of the present disclosure, accordingly, it may be possible to prevent degradation in reliability of the driving thin film transistor DT caused by hydrogen particles by partially or completely forming, over the first sub-upper buffer layer 445a, the second sub-upper buffer layer 445b covering the first light shielding pattern BSM-1.

When the second sub-upper buffer layer 445b is partially deposited on the first sub-upper buffer layer 445a, there is an advantage as follows.

That is, since the second sub-upper buffer layer 445b is formed of a material different from that of the first sub-upper buffer layer 445a, layer blister may occur between the heterogeneous material layers when the second sub-upper buffer layer 445b is deposited over the entire surface of the active area. In order to solve such a problem, the second sub-upper buffer layer 445b may be selectively formed only in a region where the first light shielding pattern BSM-1 is formed, for an enhancement in bonding force.

In some implementations, the first light shielding pattern BSM-1 is formed vertically under the first oxide semiconductor pattern 474, and to overlap with the first oxide semiconductor pattern 474. In addition, the first light shielding pattern BSM-1 may be formed to have a size greater than that of the first oxide semiconductor pattern 474, and to completely overlap with the first oxide semiconductor pattern 474.

Meanwhile, in the first embodiment of the present disclosure, the first light shielding pattern BSM-1 may include a semiconductor material layer doped with P-type ions, thereby increasing the threshold voltage of the driving thin film transistor DT. In addition, the first light shielding pattern BSM-1 may be disposed near the first oxide semiconductor pattern 474, thereby increasing the parasitic capacitance generated between the first oxide semiconductor pattern 474 and the first light shielding pattern BSM-1. In this case, the s-factor of the driving thin film transistor DT is increased and, as such, it may be possible to achieve grayscale expression even at low gray levels.

Meanwhile, the second gate electrode 478 of the driving thin film transistor DT is insulated by the third interlayer insulating layer 447. The second source electrode 479S and the second drain electrode 479D are formed on the third interlayer insulating layer 447.

Although the second source electrode 479S and the second drain electrode 479D are shown as being disposed on the same layer, and the second gate electrode 478 is shown as being formed on a layer different from that of the second source electrode 479S and the second drain electrode 479D in the first embodiment of the present disclosure referring to FIG. 4A, all of the second gate electrode 478, the second source electrode 479S, and the second drain electrode 479D may be disposed on the same layer.

The second source electrode 479S and the second drain electrode 479D are connected to the second source region 474b and the second drain region 474c via a third contact hole CH3 and a fourth contact hole CH4, respectively. In addition, the first light shielding pattern BSM-1 is connected to the second source electrode 479S via a fifth contact hole CH5.

Meanwhile, the first switching thin film transistor ST-1 includes a second oxide semiconductor pattern 432, a third gate electrode 433, a third source electrode 434S, and a third drain electrode 434D.

The second oxide semiconductor pattern 432 includes a third channel region 432a, and a third source region 432b and a third drain region 432c disposed adjacent to the third channel region 432a under the condition that the third channel region 432a is interposed therebetween.

The third gate electrode 433 is disposed over the second oxide semiconductor pattern 432 under the condition that the second gate insulating layer 446 is interposed therebetween.

The third source electrode 434S and the third drain electrode 434D may be disposed on the same layer as the second source electrode 479S and the second drain electrode 479D. That is, the second source/drain electrodes 479S and 479D and the third source/drain electrodes 434S and 434D may be disposed on the third interlayer insulating layer 447.

Of course, the third source/drain electrodes 434S and 434D may be disposed on the same layer as the third gate electrode 433. That is, the third source/drain electrodes 434S and 434D may be formed on the second gate insulating layer 446 simultaneously with the third gate electrode 433, using the same material as that of the third gate electrode 433.

In addition, a second light shielding pattern BSM-2 may be disposed under the second oxide semiconductor pattern 432.

The second light shielding pattern BSM-2 may have the same configuration as that of the first light shielding pattern BSM-1. That is, the second light shielding pattern BSM-2 may have a structure in which a first layer BSM-2a constituted by a metal material, and a second layer BSM-2b constituted by a semiconductor material are stacked. Of course, the second light shielding pattern BSM-2 may have a single-layer structure constituted by a semiconductor material layer doped with impurities.

P-type impurity ions are implanted into the second layer BSM-2b of the second light shielding pattern BSM-2.

The second light shielding pattern BSM-2 is disposed under the second oxide semiconductor pattern 432 while overlapping with the second oxide semiconductor pattern 432 in order to protect the second oxide semiconductor pattern 432 from light incident from the outside.

The second light shielding pattern BSM-2 may be formed over the first gate insulating layer 442, together with the first gate electrode 416.

The third gate electrode 433 and the second light shielding pattern BSM-2 may be electrically interconnected, thereby constituting a dual gate.

Since the second light shielding pattern BSM-2 includes a semiconductor material layer doped with P-type impurity ions, the second light shielding pattern BSM-2 may increase the threshold voltage of the first switching thin film transistor ST-1 including the oxide semiconductor pattern. In other words, as the third gate electrode 433 becomes conductive in accordance with implantation of P-type impurity ions therein, the Fermi level thereof is lowered. In addition, the Fermi level of the second oxide semiconductor pattern 432 corresponding to the third gate electrode 433 is also lowered. Accordingly, the threshold voltage of the first switching thin film transistor ST-1 is increased. Referring to FIG. 3, when the first switching thin film transistor ST-1 is a sampling transistor connected to a gate node of the driving thin film transistor DT, a great effect may be exhibited. The sampling transistor functions to provide a data voltage to one electrode of the storage capacitor during a sampling period.

The sampling transistor is known as a very sensitive transistor in which a channel thereof is opened even at a low voltage. In the first embodiment of the present disclosure, since the second light shielding pattern BSM-2, which includes the semiconductor material layer doped with P-type impurity ions, is disposed under the second oxide semiconductor pattern 432, it may be possible to increase the threshold voltage of the first switching thin film transistor ST-1 and, as such, there is an advantage in that freedom of an internal compensation circuit configuration may be enhanced.

Meanwhile, in some implementations, each of the first light shielding pattern BSM-1 and the second light shielding pattern BSM-2 is constituted by a plurality of layers including a metal material layer and a semiconductor material layer, and the semiconductor material layer is disposed over the metal material layer. This is because, for implantation of impurities in the semiconductor material layer, the semiconductor material layer should be deposited over the metal material layer such that the semiconductor material layer is exposed upwards.

Meanwhile, referring to FIG. 4A, the sub-pixel includes a storage capacitor Cst.

The storage capacitor Cst stores a data voltage applied thereto via a data line for a predetermined period, and then provides the stored data voltage to the organic light emitting element.

The storage capacitor Cst includes two electrodes corresponding to each other, and a dielectric disposed between the two electrodes. The storage capacitor Cst includes a first electrode 450A disposed on the same layer as the first gate electrode 416 and made of the same material as that of the first gate electrode 416, and a second electrode 450B facing the first electrode 450A while overlapping with the first electrode 450A.

The first interlayer insulating layer 443 may be interposed between the first electrode 450A and the second electrode 450B of the storage capacitor Cst.

The second electrode 450B of the storage capacitor Cst may be electrically connected to the second source electrode 479S via an eighth contact hole CH8.

In addition, there may be an advantage in that the number of mask processes is reduced because the first electrode 450A of the storage capacitor Cst is formed on the same layer as the first gate electrode 416 and the second light shielding pattern BSM-2.

Meanwhile, referring to FIG. 4A, a first planarization layer PLN1 may be formed over the substrate 410 on which the driving thin film transistor DT and the first switching thin film transistor ST-1 are disposed. Although the first planarization layer PLN1 may be formed of an organic material such as photoacryl, the first planarization layer PLN1 may also be constituted by a plurality of layers constituted by an inorganic layer and an organic layer. A connection electrode 455 electrically interconnects an anode 456, which is one constituent element of a light emitting device part 460, and the driving thin film transistor DT via a ninth contact hole CH9 formed in the first planarization layer PLN1.

In addition, a conductive layer used to form the connection electrode 455 may constitute a part of various link lines disposed in the bending area BA.

A second planarization layer PLN2 may be formed over the connection electrode 455. Although the second planarization layer PLN2 may be formed of an organic material such as photoacryl, the second planarization layer PLN2 may also be constituted by a plurality of layers constituted by an inorganic layer and an organic layer.

The anode 456 is formed on the second planarization layer PLN2. The anode 456 is electrically connected to the connection electrode 455 via a tenth contact hole CH10 formed in the second planarization layer PLN2.

The anode 456 may take the form of a single layer or multiple layers made of a metal such as Ca, Ba, Mg, Al, Ag, etc., or an alloy thereof. The anode 456 is connected to the second drain electrode 479D of the driving thin film transistor DT and, as such, an image signal from the outside is applied thereto.

In addition to the anode 456, an anode connection electrode 457, which electrically interconnects a common voltage line VSS and a cathode 463, may be further provided in the non-active area NA.

A bank layer 461 is formed over the second planarization layer PLN2. The bank layer 461 is a kind of barrier, and may partition sub-pixels, thereby preventing light of particular colors output from adjacent ones of the sub-pixels from being output in a mixed state.

An organic light emitting layer 462 is formed on a surface of the anode 456 and a portion of an inclined surface of the bank layer 461. The organic light emitting layer 462 may be an R-organic light emitting layer configured to emit red light, a G-organic light emitting layer configured to emit green light, or a B-organic light emitting layer configured to emit blue light, which is formed at each sub-pixel. In addition, the organic light emitting layer 462 may be a W-organic light emitting layer configured to emit white light.

The organic light emitting layer 462 may include not only a light emitting layer, but also an electron injection layer and a hole injection layer respectively configured to inject electrons and holes into the light emitting layer, an electron transportation layer and a hole transportation layer respectively configured to transport injected electrons and holes to an organic layer, etc.

The cathode 463 is formed over the organic light emitting layer 462. The cathode 463 may be made of a transparent conductive material such as indium tin oxide (ITO) or indium zinc oxide (IZO), or a thin metal allowing transmission of visible light therethrough, without being limited thereto.

An encapsulation layer part 470 is formed over the cathode 463. The encapsulation layer part 470 may be constituted by a single layer formed of an inorganic layer, a double layer of inorganic layer/organic layer, or a triple layer of inorganic layer/organic layer/inorganic layer. The inorganic layer may be constituted by an inorganic material such as $SiN_x$, SiX, or the like, without being limited thereto. In addition, the organic layer may be constituted by an organic material such as polyethylene terephthalate, polyethylene naphthalate, polycarbonate, polyimide, polyethylene sulfonate, polyoxymethylene, polyarylate, etc., or a mixture thereof, without being limited thereto.

In FIG. 4A, an embodiment of the encapsulation layer part 470 is illustrated as being constituted by a triple layer of inorganic layer 471/organic layer 472/inorganic layer 473.

A cover glass (not shown) may be disposed over the encapsulation layer part 470, and may be attached to the encapsulation layer part 470 by an adhesive layer (not shown). Although any material may be used as the adhesive layer, so long as the material exhibits excellent attachment force while being excellent in terms of heat resistance and water resistance, a thermosetting resin such as an epoxy-based compound, an acrylate-based compound, or an acryl-based rubber may be used in the present disclosure. Alternatively, a photo-curable resin may be used as the adhesive. In this case, the adhesive layer is cured through irradiation of the adhesive layer with light such as ultraviolet light.

The adhesive layer may not only serve to assemble the substrate 410 and the cover glass (not shown), but also to function as an encapsulator for preventing penetration of moisture into an interior of the display device which may be an organic electroluminescent display device.

The cover glass (not shown) may be an encapsulation cap for encapsulating the organic electroluminescent display device, and may use a protective film such as a polystyrene (PS) film, a polyethylene (PE) film, a polyethylene naphthalate (PEN) film, a polyimide (PI) film, or the like, and may use glass.

Hereinafter, a second embodiment of the present disclosure will be described with reference to FIG. 5. In the second embodiment, configurations of thin film transistors disposed in an active area AA will be described.

Figure 5:
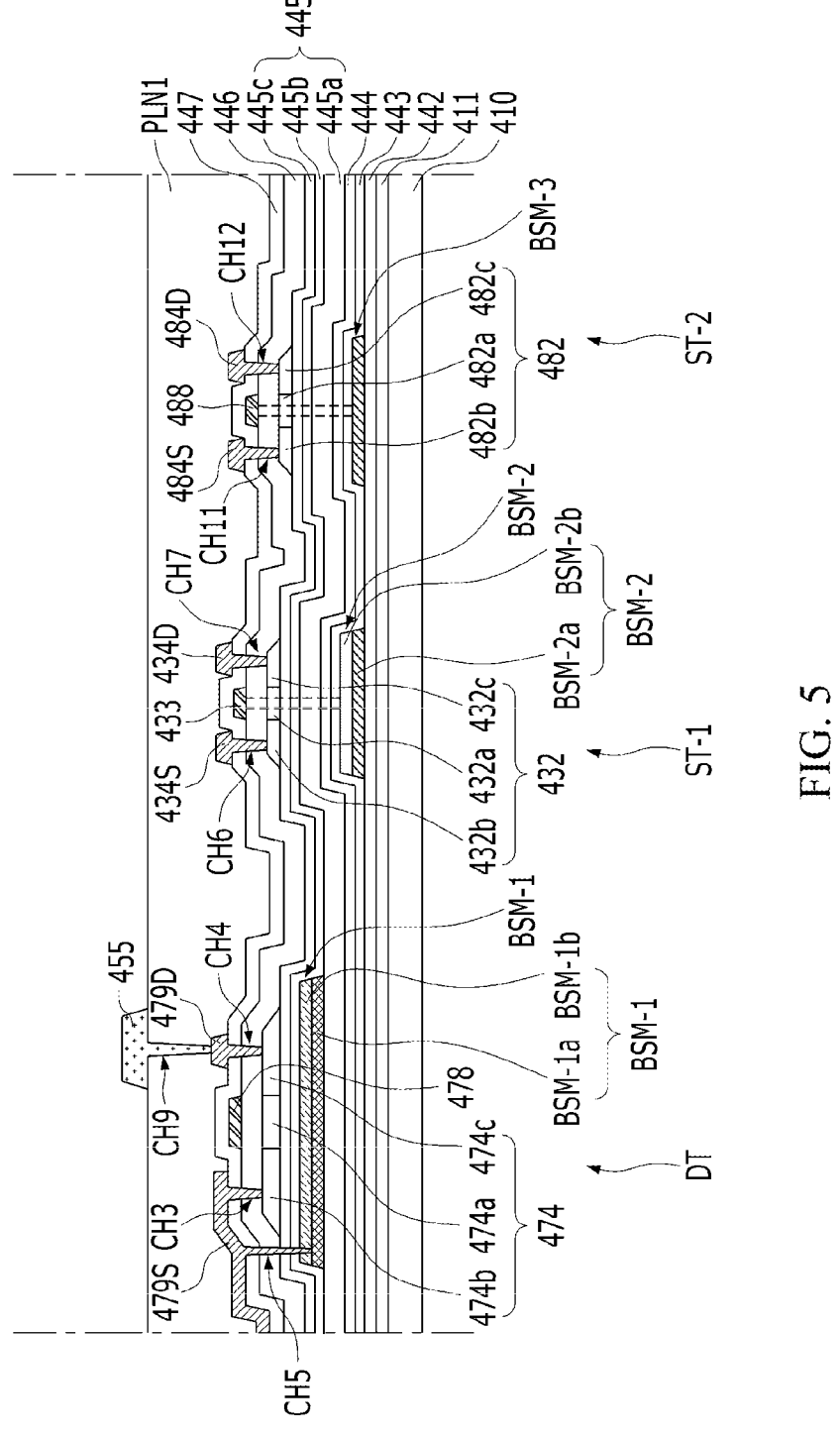
FIG. 5 is a cross-sectional view showing only a pixel part according to a second embodiment of the present disclosure.

Referring to FIG. 5, in the second embodiment, one driving thin film transistor DT and two switching thin film transistors ST-1 and ST-2 are disclosed.

The driving thin film transistor DT and the first switching thin film transistor ST-1 may have the same configurations as those of the first embodiment referring to FIG. 4A.

In the second embodiment, the first switching thin film transistor ST-1 and the second switching thin film transistor ST-2 include a second light shielding pattern BSM-2 and a third light shielding pattern BSM-3, respectively. The second light shielding pattern BSM-2 and the third light shielding pattern BSM-3 may be disposed on the same insulating layer. In addition, similarly to the first switching thin film transistor ST-1 in the first embodiment, the second light shielding pattern BSM-2 may have a structure in which a first layer BSM-2a constituted by a metal material, and a second layer BSM-2b constituted by a semiconductor material doped with P-type positive impurity ions are stacked. On the other hand, the third light shielding pattern BSM-3 may be constituted only by a metal material layer.

The first switching thin film transistor ST-1 may be a sampling transistor constituting an internal compensation circuit, and the second switching thin film transistor ST-2 may be a switching thin film transistor other than the sampling transistor. For example, the second switching thin film transistor ST-2 may be an initialization transistor.

The driving thin film transistor DT and the first switching thin film transistor ST-1 in the second embodiment may have the same configurations as those of the first embodiment and, as such, no detailed description thereof will be given.

The second switching thin film transistor ST-2 may also have the same configuration as that of the first switching thin film transistor ST-1, except for the third light shielding pattern BSM-3.

That is, the second switching thin film transistor ST-2 includes a third oxide semiconductor pattern 482 disposed on an upper buffer layer 445, a fourth gate electrode 488 disposed to overlap with the third oxide semiconductor pattern 482, and a fourth source electrode 484S and a fourth drain electrode 484D electrically connected to the third oxide semiconductor pattern 482. In addition, the second switching thin film transistor ST-2 includes the third light shielding pattern BSM-3 disposed under the third oxide semiconductor pattern 482.

The third oxide semiconductor pattern 482 includes a fourth channel region 482a, and conductive regions, that is, a fourth source region 482b and a fourth drain region 482c.

The fourth source electrode 484S and the fourth drain electrode 484D are connected to the fourth source region 482b and the fourth drain region 482c via an eleventh contact hole CH11 and a twelfth contact hole CH12, respectively.

All of second source/drain electrodes 479S and 479D, third source/drain electrodes 434S and 434D, and the fourth source/drain electrodes 484S and 484D may be disposed on the same layer, and may be simultaneously formed through one mask process, using the same material.

All of a second gate electrode 478, a third gate electrode 433, and the fourth gate electrode 488 may be formed on the same insulating layer, using the same material. In this case, formation of the gate electrodes may be achieved through one mask process.

The third light shielding pattern BSM-3 may be a light shielding pattern constituted only by a metal pattern, differently from the second light shielding pattern BSM-2.

That is, the first switching thin film transistor ST-1 exhibits an increase in threshold voltage because the first switching thin film transistor ST-1 includes the second light shielding pattern BSM-2 including the semiconductor material layer, whereas the second switching thin film transistor ST-2 does not exhibit a variation in threshold voltage caused by the third light shielding pattern BSM-3 because the third light shielding pattern BSM-3 is constituted only by a metal material layer.

In some implementations, among the switching thin film transistors constituting the internal compensation circuit of the pixel, the thin film transistor requiring an increase in threshold voltage may include a light shielding pattern including a semiconductor material layer, as in the first switching thin film transistor ST-1, and the thin film transistor not requiring a variation in threshold voltage may include a light shielding pattern constituted only by a metal pattern, as in the second switching thin film transistor ST-2.

For example, the first switching thin film transistor ST-1 may be a sampling transistor, and the second switching thin film transistor ST-2 may be an initialization transistor.

The second light shielding pattern BSM-2 and the third light shielding pattern BSM-3 may be simultaneously formed on a first gate insulating layer 442. Accordingly, a first gate electrode 416, a first electrode 450A of a storage capacitor, the second light shielding pattern BSM-2, and the third light shielding pattern BSM-3 may be simultaneously formed using one mask.

Since the second light shielding pattern BSM-2 includes the first layer BSM-2a and the second layer BSM-2b constituted by the semiconductor material layer, the mask process may be a process using a halftone mask. The halftone mask process may be performed using a known method and, as such, no detailed description thereof will be given.

Hereinafter, a third embodiment of the present disclosure will be described with reference to FIG. 6. The third embodiment has a feature in that a second light shielding pattern BSM-2 includes a semiconductor material layer doped with P-type impurity ions and is disposed near a second oxide semiconductor pattern 432, in order to increase a threshold voltage of a first switching thin film transistor ST-1.

Figure 6:
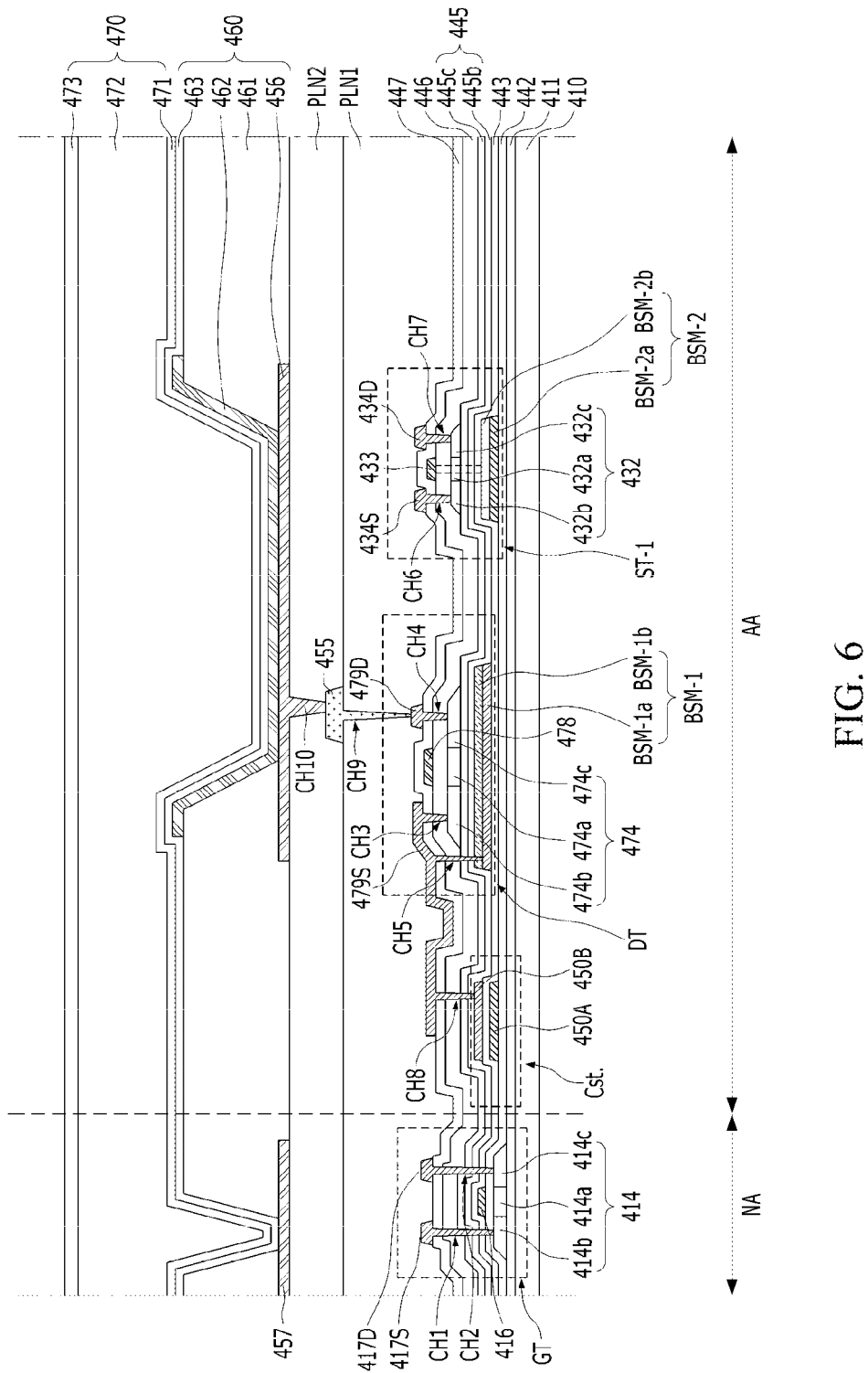
FIG. 6 is a cross-sectional view showing a third embodiment of the present disclosure.

Referring to FIG. 6, configurations of a gate driving thin film transistor GT and a storage capacitor Cst may be identical to those of the first embodiment referring to FIG. 4A. In the following description, accordingly, no detailed description of the gate-driving thin film transistor GT and the storage capacitor Cst will be given.

A first switching thin film transistor ST-1 includes a second light shielding pattern BSM-2 disposed on a first interlayer insulating layer 443, a second oxide semiconductor pattern 432 disposed over the second light shielding pattern BSM-2 while overlapping with the second light shielding pattern BSM-2, a third gate electrode 433 disposed over the second oxide semiconductor pattern 432 while overlapping with the second oxide semiconductor pattern 432, and a third source electrode 434S and a third drain electrode 434D electrically connected to the second oxide semiconductor pattern 432.

An upper buffer layer 445 is disposed between the second oxide semiconductor pattern 432 and the second light shielding pattern BSM-2.

The upper buffer layer 445 is deposited on an upper surface of the first interlayer insulating layer 443 and, as such, the first interlayer insulating layer 443 may function as a first sub-upper buffer layer 445a. Accordingly, the upper buffer layer 445 may be constituted only by a second sub-upper buffer layer 445b and a third sub-upper buffer layer 445c. However, the configuration of the upper buffer layer 445 is not limited to the configuration illustrated in FIG. 6.

The third embodiment proposes a configuration for increasing the threshold voltage of the first switching thin film ST-1 by reducing the thickness of an inorganic insulating layer disposed between the second light shielding pattern BSM-2 and the second oxide semiconductor pattern 432.

When the distance between the second light shielding pattern BSM-2 and the second oxide semiconductor pattern 432 is reduced, a parasitic capacitance generated between the two layers is increased and, as such, the threshold voltage of the first switching thin film transistor ST-1 may be increased. In addition, since the second light shielding pattern BSM-2 includes a semiconductor material layer doped with P-type positive ions, the threshold voltage may be further increased.

Accordingly, when the first switching thin film transistor ST-1 disclosed in the third embodiment is used as a sampling transistor, it may be possible to easily increase the threshold voltage of the sampling transistor.

In addition, the second light shielding pattern BSM-2 may be disposed on the same layer as a first light shielding pattern BSM-1 while having the same stack structure as that of the first light shielding pattern BSM-1, differently from the first embodiment, and, as such, the number of mask processes may be reduced.

The first light shielding pattern BSM-1 and the second light shielding pattern BSM-2 may be disposed on the first interlayer insulating layer 443, together with a second electrode 450B of a storage capacitor. Accordingly, the first light shielding pattern BSM-1, the second light shielding pattern BSM-2, and the second electrode 450B of the storage capacitor may be simultaneously formed using one mask. In addition, the first light shielding pattern BSM-1 and the second light shielding pattern BSM-2 may be simultaneously formed in one mask process using a halftone mask under the condition that a metal material layer and a semi-conductor material layer have been sequentially deposited. Accordingly, the number of mask processes may be reduced.

In the third embodiment, the second light shielding pattern BSM-2 may be electrically connected to the third gate electrode 433, thereby constituting a dual gate.

Meanwhile, a driving thin film transistor DT may have a configuration identical to the configuration disclosed in the first embodiment, except that the first light shielding pattern BSM-1 is disposed on the first interlayer insulating layer 443, and the upper buffer layer 445 has a stack structure of the second sub-upper buffer layer 445b and the third sub-upper buffer layer 445c.

Briefly, in the third embodiment, a configuration in which the first light shielding pattern BSM-1 and the second light shielding pattern BSM-2 are disposed on the same layer, thereby achieving a reduction in the number of manufacturing processes and an increase in the threshold voltage of the first switching thin film transistor ST-1, is proposed.

As apparent from the above description, a pixel of the display device according to each of the embodiments of the present disclosure includes a driving thin film transistor and a switching thin film transistor, thereby blocking leakage current in an off state. Accordingly, a reduction in power consumption may be achieved. In addition, the driving thin film transistor may have a structure capable of increasing an s-factor and, as such, a thin film transistor array substrate capable of achieving free grayscale expression at low gray levels may be provided. In addition, a thin film transistor capable of increasing a threshold voltage of the driving thin film transistor in the pixel to a predetermined target value or greater may be provided. Furthermore, a plurality of switching thin film transistors disposed in the pixel may have different threshold voltages, respectively, and, as such, each of the switching thin film transistors may have suitable characteristics suitable for a function thereof.

Effects and benefits of the present disclosure are not limited to the above-described effects. Other effects and benefits not described in the present disclosure may be readily understood by those skilled in the art.

It will be appreciated that the technical spirit of the present disclosure has been described herein only for purposes of illustration through the above description and the accompanying drawings, and that combination, separation, substitution, and modifications of components may be made by those skilled in the art without departing from the scope and spirit of the present disclosure. Therefore, the example embodiments of the present disclosure are provided for illustrative purposes only and are not intended to limit the technical spirit of the present disclosure. The scope of the technical spirit of the present disclosure is not limited thereto. The protection scope of the present disclosure should be interpreted based on the appended claims, and it should be appreciated that all technical ideas falling within a range equivalent to the claims are included in the protection scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A structure comprising:
a substrate comprising an active area and a non-active area disposed around the active area; and
a first thin film transistor, a second thin film transistor and a third thin film transistor disposed on the substrate,
wherein the first thin film transistor comprises:
an upper buffer layer disposed on the substrate and comprising at least one inorganic insulating layer;
a first oxide semiconductor pattern disposed on the upper buffer layer;
a first gate electrode disposed over the first oxide semiconductor pattern and overlapping with the first oxide semiconductor pattern;
a first source electrode and a first drain electrode each electrically connected to the first oxide semiconductor pattern; and
a first light shielding pattern disposed under the first oxide semiconductor pattern and overlapping with the first oxide semiconductor pattern, the first light shielding pattern comprising a semiconductor material layer,
wherein the second thin film transistor comprises:
a second oxide semiconductor pattern disposed on the upper buffer layer;
a second gate electrode disposed over the second oxide semiconductor pattern and overlapping with the second oxide semiconductor pattern;
a second source electrode and a second drain electrode each electrically connected to the second oxide semiconductor pattern; and
a second light shielding pattern disposed under the second oxide semiconductor pattern and overlapping with the second oxide semiconductor pattern, the second light shielding pattern comprising the semiconductor material layer,
wherein each of the first oxide semiconductor pattern and the second oxide semiconductor pattern includes an N-type semiconductor material and
the semiconductor material layer includes a P-type semiconductor material.

2. The structure according to claim 1, wherein the first light shielding pattern and the second light shielding pattern are disposed on a same layer.

3. The structure according to claim 1, wherein the first light shielding pattern is embedded in the upper buffer layer.

4. The structure according to claim 1, wherein the first light shielding pattern is electrically connected to one of the first source electrode or the first drain electrode.

5. The structure of claim 1, comprising:
a light emitting device part comprising an anode disposed on the substrate, a cathode facing the anode, and a light emitting layer disposed between the anode and the cathode.

6. The structure according to claim 1, further comprising:
a fourth thin film transistor disposed on the substrate,
wherein the fourth thin film transistor comprises:
a lower buffer layer disposed on the substrate and comprising at least one insulating layer;

a polycrystalline semiconductor pattern disposed on the lower buffer layer;

a fourth gate electrode disposed over the polycrystalline semiconductor pattern and overlapping with the polycrystalline semiconductor pattern; and a fourth source electrode and a fourth drain electrode each electrically connected to the polycrystalline semiconductor pattern.

7. The structure according to claim 6, wherein the polycrystalline semiconductor pattern and the semiconductor material layer are doped with P-type impurity ions.

8. The structure according to claim 1, wherein a first parasitic capacitance between the first light shielding pattern and the first oxide semiconductor pattern is greater than a second parasitic capacitance between the first gate electrode and the first oxide semiconductor pattern.

9. The structure according to claim 8, further comprising:

a first insulating layer disposed between the first oxide semiconductor pattern and the first gate electrode; and a second insulating layer disposed between the first oxide semiconductor pattern and the first light shielding pattern, wherein a thickness of the first insulating layer is greater than a thickness of the second insulating layer.

10. The structure according to claim 8, further comprising:

a first insulating layer disposed between the first oxide semiconductor pattern and the first gate electrode; and a second insulating layer disposed between the first oxide semiconductor pattern and the first light shielding pattern, wherein a permittivity of the second insulating layer is greater than a permittivity of the first insulating layer.

11. The structure according to claim 1, further comprising:

a third thin film transistor disposed on the substrate, wherein the third thin film transistor comprises:

a third oxide semiconductor pattern disposed on the upper buffer layer;

a third gate electrode disposed over the third oxide semiconductor pattern and overlapping with the third oxide semiconductor pattern;

a third source electrode and a third drain electrode electrically connected to the third oxide semiconductor pattern; and a third light shielding pattern disposed under the third oxide semiconductor pattern and overlapping with the third oxide semiconductor pattern.

12. The structure according to claim 11, wherein:

the third oxide semiconductor pattern includes an N-type semiconductor material.

13. The structure according to claim 11, wherein:

the third light shielding pattern includes a semiconductor material layer; and at least one of the first light shielding pattern, the second light shielding pattern or the third light shielding pattern further comprises a metal pattern; and the semiconductor material layer of the at least one of the first light shielding pattern, the second light shielding pattern or the third light shielding pattern is stacked on the metal pattern.

14. The structure according to claim 11, further comprising:

at least one interlayer insulating layer disposed between the first light shielding pattern and the second light shielding pattern, wherein the second light shielding pattern and the third light shielding pattern are disposed on a same layer.

15. The structure according to claim 11, wherein the first thin film transistor is a driving thin film transistor configured to drive a pixel, and each of the second thin film transistor and the third thin film transistor is a switching thin film transistor.

16. The structure according to claim 11, wherein:

the second light shielding pattern includes a metal pattern stacked under the semiconductor material layer of the second light shielding pattern, and the third light shielding pattern includes a metal pattern, the third light shielding pattern different from the second light shielding pattern by not including a semiconductor material layer stacked under the metal pattern of the third light shielding pattern.

17. The structure according to claim 16, wherein the second thin film transistor is a switching thin film transistor electrically connected to the first gate electrode of the first thin film transistor.

* * * * *